United States Patent
Lin et al.

(10) Patent No.: US 10,153,210 B1
(45) Date of Patent: Dec. 11, 2018

(54) SEMICONDUCTOR DEVICE AND METHOD FOR FABRICATING THE SAME

(71) Applicant: UNITED MICROELECTRONICS CORP., Hsin-Chu (TW)

(72) Inventors: Chun-Hao Lin, Kaohsiung (TW); Hsin-Yu Chen, Nantou County (TW); Chun-Tsen Lu, Tainan (TW); Shou-Wei Hsieh, Hsinchu (TW)

(73) Assignee: UNITED MICROELECTRONICS CORP., Hsin-Chu (TW)

(*) Notice: Subject to any disclaimer, the term of this patent is extended or adjusted under 35 U.S.C. 154(b) by 10 days.

(21) Appl. No.: 15/618,131

(22) Filed: Jun. 9, 2017

(51) Int. Cl.
*H01L 29/06* (2006.01)
*H01L 21/8234* (2006.01)
*H01L 21/02* (2006.01)

(52) U.S. Cl.
CPC .. *H01L 21/823462* (2013.01); *H01L 21/0228* (2013.01); *H01L 21/02164* (2013.01); *H01L 21/02233* (2013.01); *H01L 21/02269* (2013.01); *H01L 21/823431* (2013.01)

(58) Field of Classification Search
CPC ........... H01L 21/02164; H01L 21/0228; H01L 21/02233; H01L 21/02269; H01L 21/324; H01L 21/823814; H01L 21/823821; H01L 21/823431; H01L 21/823462; H01L 21/823878
USPC ......... 438/231, 283, 424, 703; 257/192, 369
See application file for complete search history.

(56) References Cited

U.S. PATENT DOCUMENTS

| | | | |
|---|---|---|---|
| 8,470,714 B1* | 6/2013 | Tsai | H01L 29/7854 438/699 |
| 8,951,884 B1* | 2/2015 | Shih | H01L 21/823431 438/424 |
| 9,035,373 B2 | 5/2015 | Lee et al. | |
| 9,450,095 B1* | 9/2016 | Bergendahl | H01L 29/7848 |
| 2007/0290250 A1 | 12/2007 | Clark, Jr. et al. | |
| 2017/0069543 A1* | 3/2017 | Chang | H01L 21/823814 |

* cited by examiner

*Primary Examiner* — Brook Kebede
(74) *Attorney, Agent, or Firm* — Winston Hsu

(57) ABSTRACT

A method for fabricating semiconductor device includes the steps of: providing a substrate having a first region and a second region; forming a first fin-shaped structure on the first region; forming a shallow trench isolation (STI) around the first fin-shaped structure; forming a first oxide layer on the first fin-shaped structure; and then forming a second oxide layer on the first oxide layer and the STI.

12 Claims, 2 Drawing Sheets

SEMICONDUCTOR DEVICE AND METHOD FOR FABRICATING THE SAME

BACKGROUND OF THE INVENTION

1. Field of the Invention

The invention relates to a method for fabricating semiconductor device, and more particularly to a method of integrating in-situ steam generation (ISSG) and atomic layer deposition (ALD processes to form gate dielectric layer on fin-shaped structures.

2. Description of the Prior Art

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the fin FET can be controlled by adjusting the work function of the gate.

However, current approach for forming gate oxide layer during fabrication of FinFET devices has found to be ineffective in that either too much silicon were consumed during the process or large leakage current was observed. Hence, how to improve this issue has become an important task in this field.

SUMMARY OF THE INVENTION

According to an embodiment of the present invention, a method for fabricating semiconductor device includes the steps of: providing a substrate having a first region and a second region; forming a first fin-shaped structure on the first region; forming a shallow trench isolation (STI) around the first fin-shaped structure; forming a first oxide layer on the first fin-shaped structure; and forming a second oxide layer on the first oxide layer and the STI.

According to another aspect of the present invention, a semiconductor device includes: a substrate having a first region and a second region; a first fin-shaped structure on the first region; a shallow trench isolation (STI) around the first fin-shaped structure; a first oxide layer on the first fin-shaped structure; and a second oxide layer on the first oxide layer and the STI.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
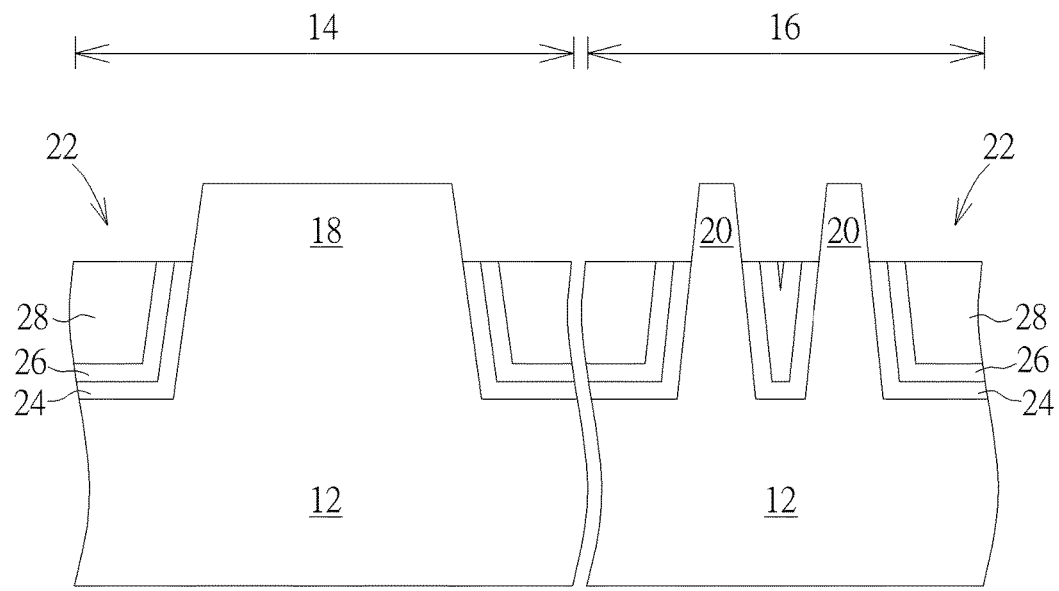
FIGS. 1-4 illustrate a method for fabricating semiconductor device according to an embodiment of the present invention.

Referring to FIGS. 1-4, FIGS. 1-4 illustrate a method for fabricating semiconductor device according to an embodiment of the present invention. As shown in FIG. 1, a substrate 12 is first provided and a first region 14 and a second region 16 are defined on the substrate 12. In this embodiment, the substrate 12 could be a semiconductor substrate including but not limited to for example a silicon substrate, an epitaxial substrate, a SiC substrate, or a silicon-on-insulator (SOI) substrate. Preferably, the first region 14 defined on the substrate 12 pertains to be an input and output (I/O) region, in which circuits will be formed in this region to connect core devices to external devices in the later process. The second region 16 on the other hand defines a core region, in which active devices including but not limited to for example metal-oxide semiconductor (MOS) transistors will be formed on this region in the later process.

Next, fin-shaped structure 18 is formed on the first region 14 and fin-shaped structures 20 are formed on the second region 16. It should be noted that even though a single fin-shaped structure 18 is formed on the first region 14 while two fin-shaped structures 20 are formed on the second region 16, the number or quantity of fin-shaped structures formed on each region is not limited to the ones disclose in this embodiment. Moreover, the fin-shaped structure 18 formed on the first region 14 or I/O region preferably includes greater width and/or greater size while the fin-shaped structures 20 disposed on the second region 16 or core region preferably includes smaller width and/or size.

According to an embodiment of the present invention, the fin-shaped structures 18 and 20 could be obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the fin-shaped structures 18 and 20 could also be obtained by first forming a patterned mask (not shown) on the substrate, 12, and through an etching process, the pattern of the patterned mask is transferred to the substrate 12 to form the fin-shaped structure 18 and 20. Moreover, the formation of the fin-shaped structures 18 and 20 could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding fin-shaped structure. These approaches for forming fin-shaped structures 18 and 20 are all within the scope of the present invention.

Next, a shallow trench isolation (STI) 22 is formed around the fin-shaped structures 18 and 20 on both first region 14 and second region 16. Preferably the formation of the STI 22 could be accomplished by sequentially forming a first liner 24 on the substrate 12 and the fin-shaped structures 18, 20 on the first region 14 and second region 16, forming a second liner 26 on the first liner 24, and a dielectric layer 28 on the second liner 26.

In this embodiment, the dielectric layer 28 preferably includes dielectric material such as but not limited to for example silicon oxide. Preferably, the first liner 24 and the second liner 26 are made of same material such as silicon oxide in this embodiment, or the two liners 24 and 26 could also include dielectric material including but not limited to for example silicon nitride, silicon oxynitride (SiON), or oxide-nitride-oxide (ONO). Nevertheless, according to an embodiment of the present invention, the first liner 24 and the second liner 26 could also be made of different material including but not limited to for example silicon oxide, silicon nitride, silicon oxynitride (SiON), oxide-nitride-oxide (ONO), or combination thereof, which are all within the scope of the present invention.

In this embodiment, the first liner 24 is preferably formed by an in-situ steam generation (ISSG) process and the second liner 26 is preferably formed by an atomic layer deposition (ALD) process. Next, an etching back process or a combination of chemical mechanical polishing (CMP) process and etching back could be conducted to remove part of the dielectric layer 28, part of the second liner 26 and part of the first liner 24 to form a STI 22 around the fin-shaped structures 18, 20 on both first region 14 and second region 16. Preferably, the first liner 24 and the second liner 26 share equal thickness, in which the thickness of the first liner 24 is between 25-30 Angstroms and the second liner 26 is also between 25-30 Angstroms, and the top surface of the STI 22 is slightly lower than the top surface of the fin-shaped structures 18, 20.

Figure 2:
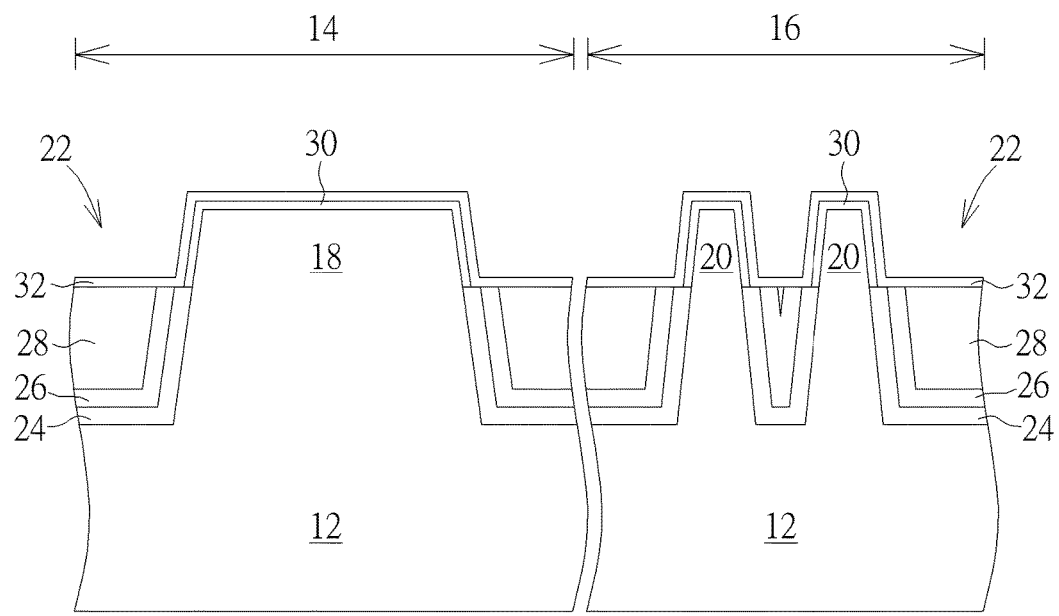

Next, as shown in FIG. 2, an in-situ steam generation (ISSG) process is conducted to form a first oxide layer (or more specifically a silicon oxide layer) 30 on the fin-shaped structures 18, 20 on both first region 14 and second region 16, in which the first oxide layer 30 preferably covers the fin-shaped structures 18, 20 protruding above the STI 22, including the top surface and part of the sidewalls of the fin-shaped structures 18, 20 but not extending to the top surface of the STI 22. In this embodiment, the thickness of the first oxide layer 30 is less than the thickness of either one of the first liner 24 and the second liner 26, and the thickness of the first oxide layer 30 is preferably between 7-15 Angstroms.

Next, an atomic layer deposition (ALD) process is conducted to form a second oxide layer (or more specifically a silicon oxide layer) 32 on the first oxide layer 30 and the STI 22, in which the second oxide layer 32 is deposited to cover the first oxide layer 30 entirely and also extending to cover the surface of the STI 22 on both first region 14 and second region 16. It should be noted that even though the second oxide layer 32 is preferably made of silicon oxide, according to an embodiment of the present invention, the second oxide layer could also include dielectric material including but not limited to for example a high-k dielectric layer or a silicon nitride layer.

According to an embodiment of the present invention, if the second oxide layer 32 or namely a dielectric layer were made of a high-k dielectric material, the high-k dielectric material could include a high-k dielectric layer having dielectric constant (k value) larger than 4. For instance, the high-k dielectric layer may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

Preferably, the thickness of the second oxide layer 32 is greater than the thickness of the first oxide layer 30 and the combined thickness of the first oxide layer 30 and the second oxide layer 32 is approximately equal to the thickness of the first liner 24 alone or the second liner 26 alone, or approximate at 30 Angstroms.

Figure 3:
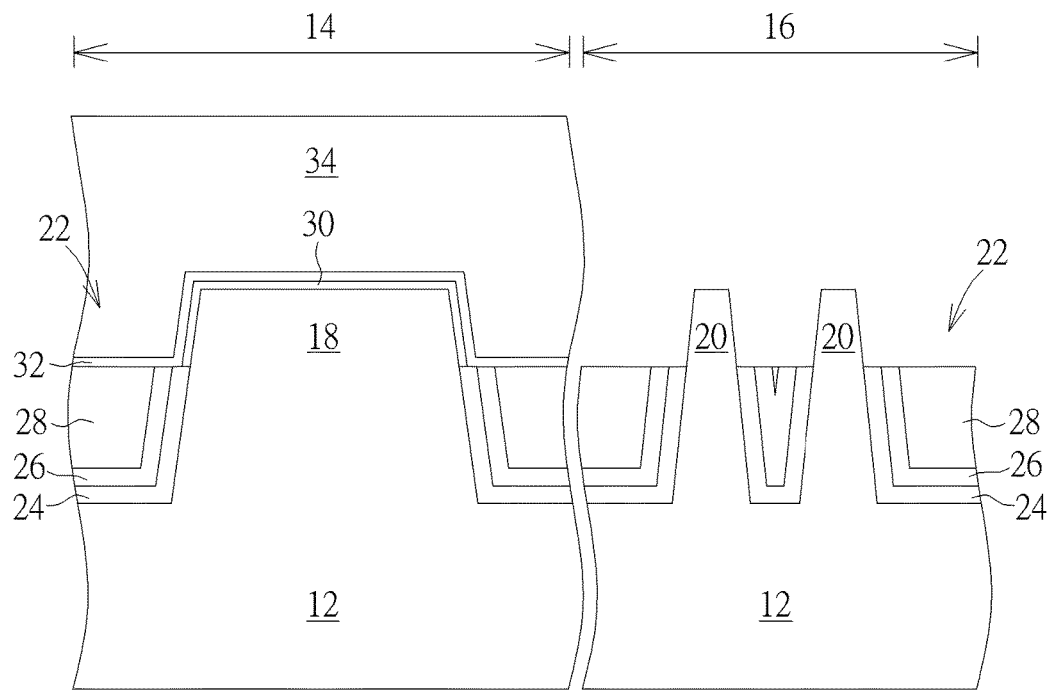

Next, as shown in FIG. 3, a patterned mask 34, such as a patterned resist is formed on the first region 14, and an etching process is conducted to completely remove the second oxide layer 32 and the first oxide layer 30 on the second region 16 to expose the fin-shaped structures 20 underneath.

Figure 4:
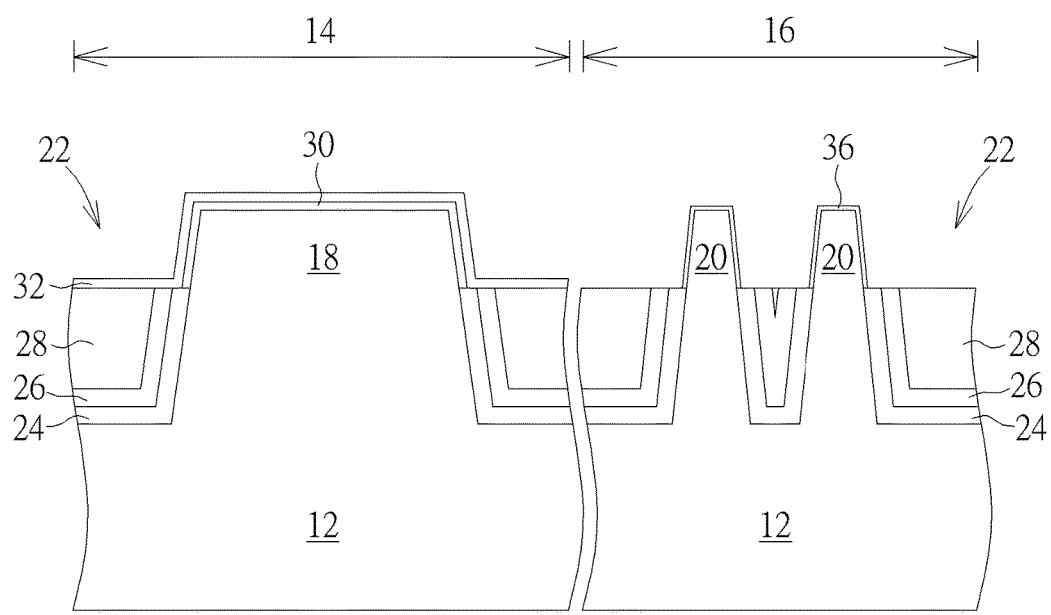

Next, as shown in FIG. 4, after exposing the fin-shaped structures 20 on the second region 16, a chemical oxidation process is conducted by immersing or treating the fin-shaped structures 20 on the second region 16 with agent including but not limited to for example hydrogen peroxide ($H_2O_2$) and/or ammonia to form a thin oxide layer or third oxide layer 36 (or more specifically a silicon oxide layer) on the fin-shaped structures 20 on second region 16. Similar to the first oxide layer 30 formed on the first region 14, the third oxide layer 36 is also formed on the top surface and part of the sidewalls of the fin-shaped structures 20 protruding above the STI 22 without extending to cover the surface of the STI 22.

Preferably, the thickness of the third oxide layer 36 formed on the second region 16 is less than the thickness of the first oxide layer 30 on the first region 14, in which the thickness of the third oxide layer 36 in this embodiment is preferably between 3-14 Angstroms and most preferably at 7 Angstroms.

After the third oxide layer 36 is formed, a gate material layer (not shown) preferably made of material such as but not limited to for example polysilicon is formed on the first region 14 and second region 16, and a photo-etching process is conducted to pattern the gate material layer for forming gate structures on the fin-shaped structure 18 on the first region 14 and fin-shaped structures 20 on the second region 16 respectively. Next, FinFET process could be carried out to form elements such as spacers around the gate structure and source/drain regions in the fin-shaped structure adjacent two sides of the spacer. Since the fabrication of a FinFET device is well known to those skilled in the art, the details of which are not explained herein for the sake of brevity.

Referring again to FIG. 4, FIG. 4 further illustrates a structural view of a semiconductor device according to an embodiment of the present invention. As shown in FIG. 4, the semiconductor preferably includes a substrate 12 having a first region 14 and a second region 16, a fin-shaped structure 18 disposed on the first region 14, fin-shaped structures 20 disposed on the second region 16, a STI 22 around the fin-shaped structures 18, 20, a first oxide layer 30 and a second oxide layer 32 disposed on the fin-shaped structure 18 on the first region 14, and a third oxide layer 36 disposed on the fin-shaped structures 20 on the second region 16.

In this embodiment, the first oxide layer 30 is disposed only on the fin-shaped structure 18 protruding above the STI 22 without extending to cover the surface of the STI 22, the second oxide layer 32 is disposed on the first oxide layer 30 while covering the STI 22, and the third oxide layer 36 is disposed only on the fin-shaped structures 20 protruding above the STI 22 without extending to the surface of the adjacent STI 22.

Preferably, the STI 22 includes a first liner 24 on the substrate 12 and part of the sidewalls of the fin-shaped structures 18, 20, a second liner 26 on the first liner 24, and a dielectric layer 28 on the second liner 26. The first liner 24, the second liner 26, and the dielectric layer 28 could all include dielectric material such as but not limited to for example silicon oxide.

In this embodiment, the thickness of the first liner 24 is substantially the same as the thickness of the second liner 26, the thickness of the first liner 24 is greater than the thickness of the first oxide layer 30, the thickness of the second oxide layer 32 is slightly greater than the thickness of the first oxide layer 30, the thickness of the first oxide layer 30 is greater than the thickness of the third oxide layer 36, and the thickness of either the first liner 24 alone or the second liner 26 alone is substantially equal to a combined thickness of the first oxide layer 30 and the second oxide layer 32.

Overall, the present invention first conducts an ISSG process to form a first oxide layer 30 preferably on the fin-shaped structure 18 on an I/O region (or the aforementioned first region 14) and then conducts an ALD process to form a second oxide layer 32 on the first oxide layer 30, in which the first oxide layer 30 and the second oxide layer 32 together serving as a gate dielectric layer for the device on the I/O region.

In contrast to the convention approach of carrying out only an ISSG process or only an ALD process to form a single oxide layer on the fin-shaped structure on the I/O region, the present invention takes the advantage of both processes by sequentially performing an ISSG process and an ALD process to form two consecutive oxide layers on the fin-shaped structure. This eliminates the drawbacks of overly consuming silicon substrate thereby shrinking the critical dimension (CD) of the fin width and improves leakage current substantially.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
    providing a substrate having a first region and a second region;
    forming a first fin-shaped structure on the first region;
    forming a shallow trench isolation (STI) around the first fin-shaped structure;
    after forming the STI performing an in-situ steam generation (ISSG) process to form a first oxide layer on the first fin-shaped structure so that the first oxide layer covers a top surface and sidewalls of the first fin-shaped structure without extending to a top surface of the STI; and
    forming a second oxide layer on and directly contacting the first oxide layer and the STI.

2. The method of claim 1, further comprising:
    forming a second fin-shaped structure on the second region;
    forming the STI around the second fin-shaped structure;
    forming the first oxide layer on the first fin-shaped structure and the second fin-shaped structure; and
    forming the second oxide layer on the first oxide layer on the second region.

3. The method of claim 2, further comprising:
    forming a patterned mask on the first region;
    removing the second oxide layer and the first oxide layer on the second region; and
    forming a third oxide layer on the second fin-shaped structure.

4. The method of claim 1, further comprising performing an atomic layer deposition (ALD) process to form the second oxide layer.

5. The method of claim 1, wherein a thickness of the first oxide layer is less than a thickness of the second oxide layer.

6. The method of claim 1, further comprising:
    forming a first liner on the first fin-shaped structure;
    forming a second liner on the first liner; and
    forming a dielectric layer on the second liner.

7. The method of claim 6, wherein the first liner and the second liner comprise same material.

8. The method of claim 6, wherein the first liner and the second liner comprise silicon oxide.

9. The method of claim 6, further comprising performing an in-situ steam generation (ISSG) process to form the first liner.

10. The method of claim 6, further comprising performing an atomic layer deposition (ALD) process to form the second liner.

11. The method of claim 6, wherein the thicknesses of the first liner and the second liner are equivalent.

12. The method of claim 6, wherein a thickness of the first liner is greater than a thickness of the first oxide layer.

* * * * *